United States Patent [19]
Wong et al.

[11] Patent Number: 5,661,684
[45] Date of Patent: Aug. 26, 1997

[54] DIFFERENTIAL SENSE AMPLIFIER

[75] Inventors: Robert Chi-Foon Wong, Poughkeepsie; Taqi Nasser Buti, Millbrook; Seiki Ogura, Wappingers Falls, all of N.Y.

[73] Assignee: International Business Machines Corporation, Armonk, N.Y.

[21] Appl. No.: 577,177

[22] Filed: Dec. 22, 1995

[51] Int. Cl.$^6$ .............................. G11C 11/34; G11C 7/02
[52] U.S. Cl. ................... 365/185.21; 365/185.2; 365/207; 327/52
[58] Field of Search .............. 365/185.21, 185.2, 365/208, 205, 207; 327/52

[56] References Cited

U.S. PATENT DOCUMENTS

| 4,195,239 | 3/1980 | Suzuki | 365/208 X |
| 4,494,020 | 1/1985 | Konishi | 365/208 X |
| 4,694,205 | 9/1987 | Shu et al. | 307/530 |
| 4,816,706 | 3/1989 | Dhong et al. | 307/530 |
| 4,984,204 | 1/1991 | Sato et al. | 365/189 |
| 5,197,028 | 3/1993 | Nakai | 365/185 |
| 5,200,919 | 4/1993 | Kaya | 365/185 |
| 5,309,400 | 5/1994 | Akaogi | 365/189 |
| 5,331,597 | 7/1994 | Tanaka | 365/207 |

OTHER PUBLICATIONS

Shoji, K. et al., Novel Automatic Erase Technique Using An Internal Voltage Generator For 1MBit Flash EEPROM, Jun. 7, 1990, Symposium on VLSI Circuits, Digest of Technical Papers, pp. 99–100.

Baker, A. et al., 3.3V 16Mb Flash Memory With Advanced Write Automation, Feb. 1994, IEEE International Solid State Circuits Conference, pp. 146–147.

Kuo, C. et al., 512-kb Flash EEPROM Embedded in an 32-b Microcontroller, Apr. 1992, IEEE J. of Solid State Circuits, pp. 574–582.

*Primary Examiner*—David C. Nelms
*Assistant Examiner*—Hoang Huan
*Attorney, Agent, or Firm*—Heslin & Rothenberg, P.C.

[57] ABSTRACT

An improved differential sense amplifier for sensing differences in a parameter at a first locus coupled with a first signal source and a second locus coupled with a second signal source. The sensing is effected by a first sensing element coupled with the first locus and a second sensing element coupled with the second locus. The improvement comprises the first sensing element and the second sensing element having differing sensitivities. In the preferred embodiment of the invention, the sensing elements are field effect transistors, and the sensitivity is established by a threshold voltage characteristic. Preferably, the first signal source provides a dynamic signal to be measured and the second signal source provides a reference signal against which the dynamic signal's changes are compared.

17 Claims, 3 Drawing Sheets

DIFFERENTIAL SENSE AMPLIFIER

BACKGROUND OF THE INVENTION

The present invention is directed to an improved differential sense amplifier; differential amplifiers are widely used in memory sensing circuitry accessing. In particular, the present invention is directed to a differential sense amplifier having improved sensitivity.

One example of the use of differential amplifiers for memory sensing circuitry is in flash programmable read only memories (PROM). In such flash PROMs, a dummy reference bit line is generally used as one of a pair of differential inputs to a differential sense amplifier. The other of the pair of inputs is the input to be measured for changes with respect to the dummy reference bit line. It is important that there be a definitive distinction between the paired inputs in each of two states of the monitored memory, or bit, cell. There usually is an indication of a logical "1" in one cell state, such as when the cell is charged or contains data; and a logical "0" in another cell state, such as when the cell is not charged or contains no data. The sensitivity of the sense amplifier is a key consideration in determining the respective states of bit cells in a memory array.

SUMMARY OF THE INVENTION

An improved differential sense amplifier for sensing differences in a predetermined parameter at a first locus, or site, and a second locus, or site. The first locus is coupled with a first signal source and the second locus is coupled with a second signal source. The sensing is effected by a first sensing element coupled with the first locus and a second sensing element coupled with the second locus. The improvement comprises the first sensing element and the second sensing element having differing sensitivities. In the preferred embodiment of the invention, the first sensing element is a first field effect transistor and the second sensing element is a second field effect transistor, and the sensitivity in the first and second field effect transistors is established by a threshold voltage characteristic for each of the first and second sensing elements. Preferably, the first signal source provides a dynamic signal to be measured and the second signal source provides a reference signal against which the dynamic signal's changes are compared.

It is, therefore, an object of the present invention to provide an improved differential sense amplifier having a stable true reference voltage source.

Further objects and features of the present invention will be apparent from the following specification and claims when considered in connection with the accompanying drawings illustrating the preferred embodiment of the invention.

DETAILED DESCRIPTION OF THE INVENTION

Figure 1:
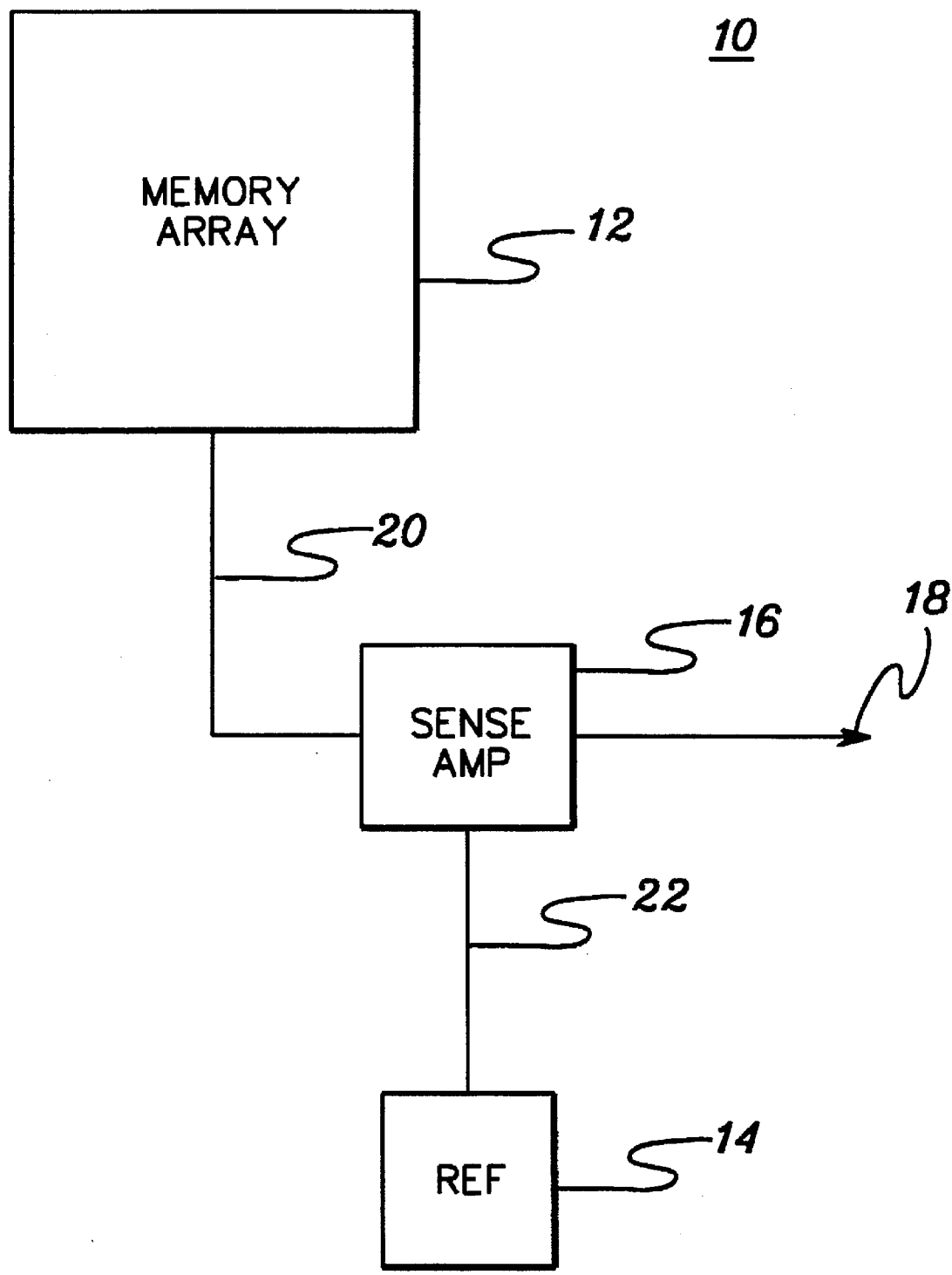
FIG. 1 is schematic block diagram of a differential sense amplifier incorporated in a prior art storage system for use with a computing device.

FIG. 1 is schematic block diagram of a differential sense amplifier incorporated in a storage system for use with a computing device. In FIG. 1, a storage system 10 includes a memory array 12, a sense amplifier 16, and a reference load 14. Sense amplifier 16 receives a parametric signal from memory array 12 via a line 20 and receives a parametric signal from reference load 14 via a line 22. Sense amplifier 16 is a differential sense amplifier, so when the parameter represented by the parametric signal on line 20 (the dynamic signal) varies more than a predetermined amount from the parameter represented by the parametric signal on line 22 (the reference signal), sense amplifier 16 generates an output at output 18. Storage system 10 functions acceptably so long as reference load 14 and memory array 12 track nominally together. That is, for example, if ambient conditions such as temperature or humidity affect the parametric response of reference load 14 and memory array 12 differently, or if other factors cause deviations in the parametric responses of those components, then there is inaccuracy in the indication provided by output 18 vis-a-vis the true relationship between the parametric signals on lines 20,22. Another problem with such prior art storage systems as illustrated in FIG. 1 has been in the responsiveness of the system to state changes. That is, usually the signal present at output 18 is a logical "1" when the signals present on lines 20, 22 are equal. In such a device the output will change to a logical "0" only after line 20 (e.g., a bit line from memory array 12) is pulled down sufficiently to overcome internal bias within sense amplifier 16. Thus, there is a predilection by storage system 10 toward an output signal at output 18 of a logical "1". The response of storage system 10 can be made more sensitive to change if the internal bias within sense amplifier 16 can be precisely controlled. In most such storage systems as storage system 10 having sense amplifier 16 configured as a differential sense amplifier, the sensing elements of sense amplifier 16 are field effect transistors. In operation, the bit lines from memory array 12 selected for evaluation, such as line 20 in FIG. 1, as well as the reference line 22, are set to a fixed voltage during an operation known generally as precharging. The selected bit lines (line 20) are released from the fixed voltage during evaluation and differences between signals on the bit line (line 20) and the reference, or dummy, line 22 are evaluated. In the case of a differential sense amplifier using field effect transistors for sensing elements, adjusting the Nwell bias on the PFETs (to be discussed hereinafter) can be used to precisely control the internal bias. By "unfairly" setting the Nwell bias, thus controlling the threshold voltage of the field effect transistors comprising the sensing elements of sense amplifier 16, greater sensitivity may be realized in storage system 10.

Figure 2:
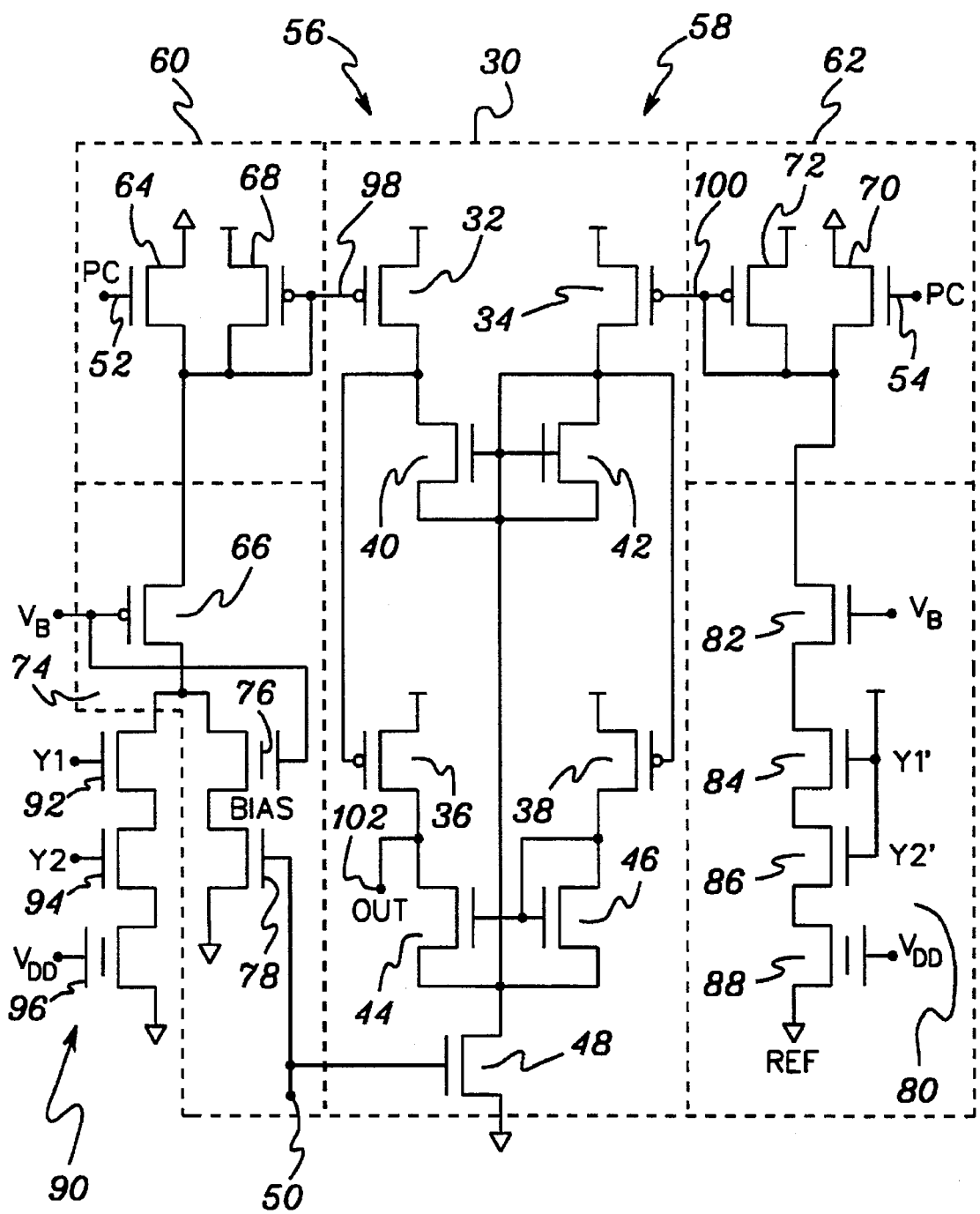
FIG. 2 is an electrical schematic diagram of a prior art differential sense amplifier appropriate for use in the system illustrated in FIG. 1.

FIG. 2 is an electrical schematic diagram of a prior art differential sense amplifier appropriate for use in the system illustrated in FIG. 1. In FIG. 2, a differential sense amplifier 30 is comprised of p-type field effect transistors (PFETs) 32, 34, 36, 38; n-type field effect transistors (NFETs) 40, 42, 44, 46, 48. A sense amplifier enable (SAE) signal is applied to a terminal 50; SAE signal is LOW during precharge so that NFET 48 is not gated. Also during precharge, a precharge signal (PC) is applied to terminals 52, 54. Terminals 52, 54 are coupled with precharging circuits 60, 62. Precharging circuit 60 includes NFET 64 and PFET 68. Precharging circuit 62 includes NFET 70 and PFET 72. The PC signal is HIGH during precharging in order to ensure that the dynamic side 56 and the reference side 58 of differential sense amplifier 30 are brought to the same potential. Dynamic side 56 of differential sensing amplifier 30 includes PFETs 32, 36 and NFETs 40, 44; Reference side 58 differential sense amplifier 30 includes PFETs 34, 38 and NFETs 42, 46. By the PC signal being HIGH, NFETs 64, 70 are gated to ground, which draws the gates of PFETs 32, 34, 68, 72 LOW, thereby gating PFETs 32, 34, 68, 72 and precharging dynamic side 56 and reference side 58.

A bias circuit 74 is coupled with dynamic side 56 of differential sense amplifier 30. Bias circuit 74 includes NFETs 66, 76, 78. NFET 78 is gated by the SAE signal. A bias voltage signal $V_B$ gates NFETs 66, 76. Word lines 90, including word line $Y_1$ and word line $Y_2$, respectively gate NFETs 92, 94. A supply voltage signal $V_{DD}$ gates NFET 96.

A reference circuit 80 is coupled with reference side 58 of differential sense amplifier 30. Reference circuit 80 includes NFETs 82, 84, 86, 88. NFET 82 is gated by bias voltage signal $V_B$; NFETs 84, 86 are gated in a manner to establish dummy word lines $Y_1'$ and $Y_2'$ as reference simulations of word lines $Y_1$ and $Y_2$. NFET 88 is gated by supply voltage signal $V_{DD}$. NFET 88 and NFET 76 are chosen to be substantially similar devices in order that reference circuit 80 can accurately track with the storage array (not shown) connected with word lines $Y_1$ and $Y_2$. The problem with this prior art design for employment of a differential sense amplifier with a storage array is that ambient conditions and electrical characteristics affect the storage array differently than they affect reference circuit 80. Thus, signals sensed at dynamic sense node 98, coupled with dynamic side 56 of differential sense amplifier 30 do not necessarily track reliably and accurately with signals sensed at reference sense node 100 coupled with reference side of differential sense amplifier 30. As a result there may be differences sensed by differential sense amplifier 30 between dynamic sense node 98 and reference sense node 100, and indicated at sense out terminal 102, which are not true sensed differences for which differential sense amplifier 30 is intended to indicate, but which are merely indications of inaccurate tracking between dynamic sense node 98 and reference sense node 100.

Figure 3:
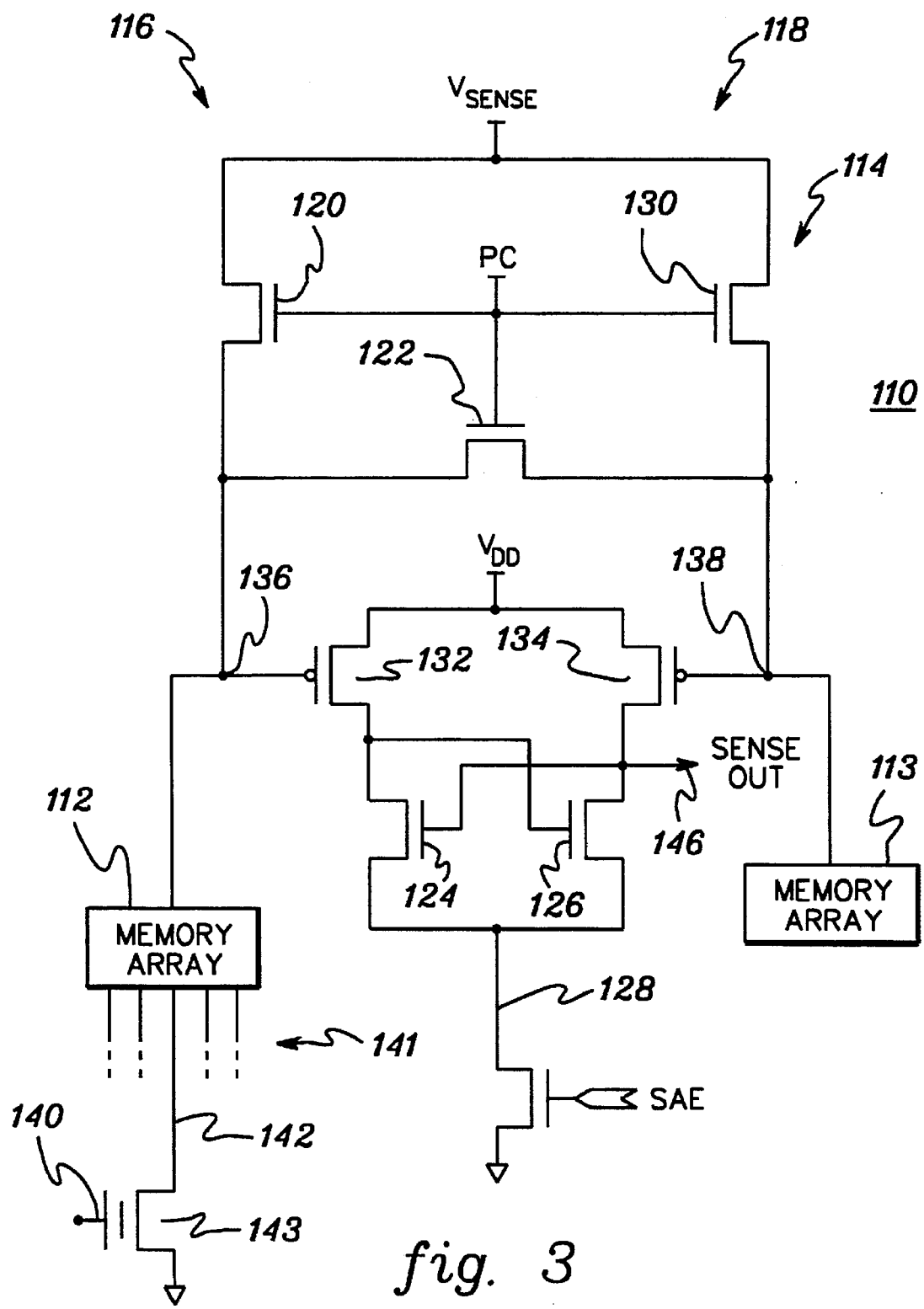
FIG. 3 is an electrical schematic diagram of the preferred embodiment of the differential sense amplifier of the present invention.

FIG. 3 is an electrical schematic diagram of the preferred embodiment of the differential sense amplifier of the present invention. In FIG. 3, a storage system 110 includes a memory array 112 and a differential sense amplifier 114. Differential sense amplifier 114 includes NFETs 120, 122, 124, 126, 128, 130 and PFETs 132, 134. Differential Sense Amplifier 114 is arranged with a dynamic side 116 and a reference side 118. Dynamic side 116 includes NFETs 120, 124 and PFET 132; Reference side 118 includes NFETs 126, 130 and PFET 134. A sense amplifier enable (SAE) signal is applied to the gate of NFET 128 and remains LOW (thereby precluding gating of NFET 128) during precharging of differential sense amplifier 114. A precharging signal (PC) is applied to the gates of NFETs 120, 122, 130. The PC signal is HIGH during precharging of differential sense amplifier 114, thereby gating NFETs 120, 122, 130 and precharging dynamic sense node 136 and reference sense node 138 to the same voltage potential, $V_{SENSE}$. An important design aspect of differential sense amplifier 114 is that the threshold voltage $V_{TH}$ of PFET 132 is not the same as the $V_{TH}$ of PFET 134. Preferably, the $V_{TH}$ of PFET 132 is lower than the $V_{TH}$ of PFET 134. Representative values for the respective PFET $V_{TH}$ parameters are, for PFET 132: 2.5 volts; for PFET 134: 3.3 volts. This variance in $V_{TH}$ is straightforwardly and reliably achieved in production volume products by varying the width of the respective PFETs 132, 134 during their fabrication to establish a different Nwell bias for the respective devices. A greater width yields a greater Nwell bias and, consequently yields a higher $V_{TH}$.

Thus, in operation, when a word line, such as word line 140, selects a bit line 142 from among the set of bit lines 141 of memory array 112, precharging has been effected regarding differential sense amplifier 114, and evaluation is effected. The precharging signal PC is LOW, thus turning off NFETs 120, 122, 130, and the signal SAE is HIGH, thus gating NFET 128.

When precharged, differential sense amplifier 114 has dynamic sense node 136 and reference sense node 138 at the same potential, $V_{SENSE}$, indicating a logical "1" at each sense node 136, 138. When the evaluated bit cell 143 designated by word line 140 and bit line 142 is charged (i.e., the cell is storing a logical "1"), dynamic sense node 136 remains at a logical "1" level, and differential sense amplifier 114 will output a "1" signal at output terminal 146. If the evaluated bit cell 143 is storing a logical "0" (i.e., is not charged), dynamic sense node 136 registers at a lower potential than reference sense node 138 during evaluation, and differential sense amplifier 114 will output a "0" signal at output terminal 146. The "unfair" $V_{TH}$ values for PFETs 132, 134 sensitize dynamic sense node 136 to bit cell changes and improve sensitivity of differential sense amplifier 114 vis-a-vis prior art differential sense amplifiers, such as differential sense amplifier 30 of FIG. 2.

According to another embodiment of the invention, an improved differential sense amplifier is provided for sensing differences in a predetermined parameter at a first and second locus. The first locus is coupled with a first storage array 112. The second locus is coupled with a second storage array 113. The sensing is effected by a first sensing element coupled with the first locus and a second sensing element coupled with a second locus. The first sensing element and the second sensing element have differing sensitivities, as discussed above. Further, the differential sense amplifier is configurable for selective operation in at least two modes: a first mode of the at least two modes establishing one storage array of the first and second storage arrays as a reference load and establishing the other storage array as dynamic load. A second mode establishes the other storage array as the reference load and establishes the one storage array as a dynamic load. The amplifier senses changes in the parameter in the dynamic load with respect to the reference load.

It is to be understood that, while the detailed drawings and specific examples given describe preferred embodiments of the invention, they are for the purpose of illustration only, that the structure and method of the invention are not limited to the precise details and conditions disclosed, and that various changes may be made therein without departing from the spirit of the invention which is defined by the following claims.

We claim:

1. An improved differential sense amplifier for sensing differences in a predetermined parameter at a first locus and a second locus; said first locus being coupled with a first signal source; said sensing being effected by a first sensing element coupled with said first locus and a second sensing element coupled with said second locus; the improvement comprising:

said first sensing element and said second sensing element having intentionally designed therein differing sensitivities sufficient to provide a predictable parameter value at an output of said sense amplifier upon activating said sense amplifier when no difference exists in the predetermined parameter between the first locus and the second locus.

2. An improved differential sense amplifier for sensing differences in a predetermined parameter as recited in claim 1 wherein said sensitivity in said first sensing element and said second sensing element is established by a threshold voltage characteristic for each of said first sensing element and said second sensing element.

3. An improved differential sense amplifier for sensing differences in a predetermined parameter as recited in claim 1 wherein said first signal source provides a dynamic signal and a second signal source provides a reference load to said second locus.

4. An improved differential sense amplifier for sensing differences in a predetermined parameter as recited in claim 1 wherein an opposite predictable parameter value is provided at the output of said sense amplifier if any difference in the predetermined parameter exists between the first locus and the second locus, the differential sense amplifier therefore not using any other reference parameter source during its activation to sense the differences.

5. An improved differential sense amplifier for sensing differences in a predetermined parameter as recited in claim 1 wherein said first sensing element is a first field effect transistor and said second sensing element is a second field effect transistor.

6. An improved differential sense amplifier for sensing differences in a predetermined parameter as recited in claim 5 said sensitivity in said first field effect transistor and said second field effect transistor is established by a threshold voltage characteristic for each of said first sensing element and said second sensing element.

7. An improved differential sense amplifier for sensing differences in a predetermined parameter as recited in claim 6 wherein said first signal source provides a dynamic signal and a second signal source provides a reference load to said second locus.

8. An improved differential sense amplifier for sensing differences in a predetermined parameter at a first locus and a second locus; said first locus being coupled with a storage array; said sensing being effected by a dynamic sensing element coupled with said first locus and a reference sensing element coupled with said second locus; the improvement comprising:

said dynamic sensing element and said reference sensing element having intentionally designed therein differing sensitivities sufficient to provide a predictable parameter value at an output of said sense amplifier upon activating said sense amplifier when no difference exists in the predetermined parameter between the first locus and the second locus.

9. An improved differential sense amplifier for sensing differences in a predetermined parameter as recited in claim 8 wherein said sensitivity in said dynamic sensing element and said reference sensing element is established by a threshold voltage characteristic for each of said dynamic sensing element and said reference sensing element.

10. An improved differential sense amplifier for sensing differences in a predetermined parameter as recited in claim 8 wherein an opposite predictable parameter value is provided at the output of said sense amplifier if any difference in the predetermined parameter exists between the first locus and the second locus, the differential sense amplifier therefore not using any other reference parameter source during its activation to sense the differences.

11. An improved differential sense amplifier for sensing differences in a predetermined parameter as recited in claim 8 wherein said dynamic sensing element is a first field effect transistor and said reference sensing element is a second field effect transistor.

12. An improved differential sense amplifier for sensing differences in a predetermined parameter as recited in claim 11 wherein said sensitivity in said first field effect transistor and said second field effect transistor is established by a threshold voltage characteristic for each of said dynamic sensing element and said reference sensing element.

13. An improved differential sense amplifier for sensing differences in a predetermined parameter at a first locus and a second locus; said first locus being coupled with a first storage array; said second locus being coupled with a second storage array; said sensing being effected by a first sensing element coupled with said first locus and a second sensing element coupled with said second locus; the improvement comprising:

said first sensing element and said second sensing element having intentionally designed therein differing sensitivities sufficient to provide a predictable parameter value at an output of said sense amplifier when activating said sense amplifier when no difference exists in the predetermined parameter between the first locus and the second locus; and the differential sense amplifier being configured for selective operation in at least two modes; a first mode of said at least two modes establishing one storage array of said first storage array and said second storage array as a reference load and establishing the other storage array of said first storage array and said second storage array other than said one storage array as a dynamic load; a second mode of said at least two modes establishing said other storage array as a reference load and establishing said one storage array as a dynamic load; the amplifier sensing changes in said parameter in said dynamic load with respect to said reference load.

14. An improved differential sense amplifier for sensing differences in a predetermined parameter as recited in claim 13 wherein said sensitivity in said first sensing element and said second sensing element is established by a threshold voltage characteristic for each of said first sensing element and said second sensing element.

15. An improved differential sense amplifier for sensing differences in a predetermined parameter as recited in claim 13 wherein an opposite predictable parameter value is provided at the output of said sense amplifier if any difference in the predetermined parameter exists between the first locus and the second locus, the differential sense amplifier therefore not using any other reference parameter source during its activation to sense the differences.

16. An improved differential sense amplifier for sensing differences in a predetermined parameter as recited in claim 13 wherein said first sensing element is a first field effect transistor and said second sensing element is a second field effect transistor.

17. An improved differential sense amplifier for sensing differences in a predetermined parameter as recited in claim 16 wherein said sensitivity in said first field effect transistor and said second field effect transistor is established by a threshold voltage characteristic for each of said first sensing element and said second sensing element.

* * * * *